United States Patent
van den Berg et al.

(10) Patent No.: US 10,008,985 B2
(45) Date of Patent: Jun. 26, 2018

(54) INPUT/OUTPUT CELL FOR INTEGRATED CIRCUITS

(71) Applicant: NXP B.V.

(72) Inventors: Henricus Hubertus van den Berg, Nijmegen (NL); Michiel Alexander Hallie, Nijmegen (NL); Joannes Theodorus van der Heiden, Arnhem (NL)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/633,375

(22) Filed: Jun. 26, 2017

(65) Prior Publication Data
US 2018/0019709 A1 Jan. 18, 2018

(30) Foreign Application Priority Data
Jul. 15, 2016 (EP) .................................. 16179764

(51) Int. Cl.
*H03F 1/02* (2006.01)
*H03K 19/0185* (2006.01)
*H03F 3/50* (2006.01)
*H02M 1/08* (2006.01)

(52) U.S. Cl.
CPC .......... *H03F 1/0255* (2013.01); *H02M 1/082* (2013.01); *H03F 3/50* (2013.01); *H03K 19/018521* (2013.01)

(58) Field of Classification Search
None
See application file for complete search history.

(56) References Cited

U.S. PATENT DOCUMENTS

| | | |
|---|---|---|
| 2003/0137440 A1* | 7/2003 | Ranganathan ...... H04L 27/0002 341/155 |
| 2006/0132163 A1 | 6/2006 | Walker et al. |
| 2006/0202707 A1 | 9/2006 | Harjung |
| 2014/0009129 A1 | 1/2014 | Shimizu et al. |

OTHER PUBLICATIONS

Hao, H. et al. "Very-low-voltage testing for weak CMOS logic ICs", IEEE Proceedings of Intl. Test Conf (ITC), pp. 275-284 (1993).

* cited by examiner

*Primary Examiner* — Jany Richardson
(74) *Attorney, Agent, or Firm* — Rajeev Madnawat

(57) ABSTRACT

An integrated circuit and method are provided. The integrated circuit comprises: a digital core configured to output a first voltage signal; and a first input/output cell; wherein the first input/output cell is configured to convert the first voltage signal to a first current signal and provide the first current signal to circuitry external to the integrated circuit.

8 Claims, 2 Drawing Sheets

INPUT/OUTPUT CELL FOR INTEGRATED CIRCUITS

CROSS-REFERENCE TO RELATED APPLICATIONS

Figure 1:
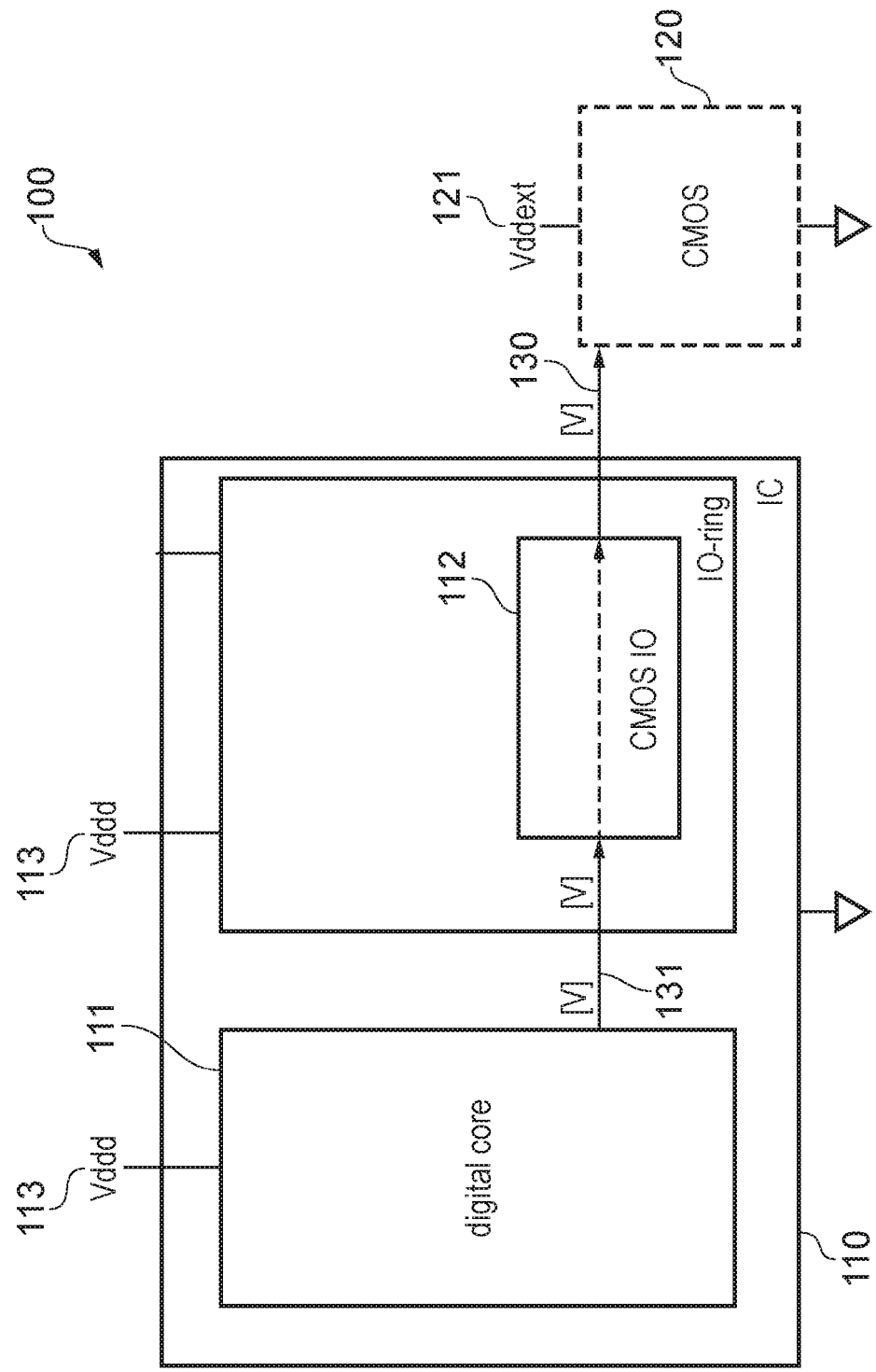

This application claims the priority under 35 U.S.C. § 119 of European Patent application no. 16179764.2, filed on Jul. 15, 2016, the contents of which are incorporated by reference herein.

FIELD

This invention relates to the provision of output signals of a digital integrated circuit and in particular but not exclusively to the provision of those signals under low voltage conditions.

BACKGROUND

Input and output signals from a digital core of an integrated circuit (IC) may be provided externally to the integrated circuit through input/output cells, for example complementary metal oxide semiconductor (CMOS) IO Cells. In some systems, the power supply to the integrated circuit may differ to that of the external circuitry and the CMOS IO cell operates to convert a voltage from the digital core to a voltage in line with the power supply of the external circuitry.

ICs are often tested to check their functionality. As digital cores may be expected to operate under low supply voltage conditions, these conditions may be used to test the operation of the IC. In order for the output of the digital core under these test conditions to be analysed, the CMOS IO cells should also be able to handle the low voltage supply conditions.

Embodiments of the present application aim to address this.

SUMMARY

According to a first aspect, there is provided an integrated circuit comprising: a digital core configured to output a first voltage signal; and a first input/output cell; wherein the first input/output cell is configured to convert the first voltage signal to a first current signal and provide the first current signal to circuitry external to the integrated circuit.

The integrated circuit may further comprise; a second input/output cell configured to convert the first voltage signal to a second voltage signal and provide the second voltage signal to circuitry external to the integrated circuit. The first voltage may correspond to a supply voltage of the integrated circuit and the second voltage corresponds to the supply voltage of the external circuitry. The first current signal may be provided to a first circuit external to the integrated circuit, the first circuit being configured to convert the first current into a third voltage.

The integrated circuit may be in a first voltage domain and the circuitry external to the integrated circuit is in a second voltage domain. The first input/output cell may be configured to operate in low voltage conditions. The first circuit may comprise a transimpedance amplifier.

According to a second aspect, there is provided a method comprising: providing a first output voltage signal from a digital core to a first input/output cell; converting the first voltage signal to a first current signal by the first input/output cell; and providing the first current signal to circuitry external to the integrated circuit.

The method may further comprise: further providing the first voltage output signal to is a second input/output cell; converting the first voltage signal to a second voltage signal by the second input/output cell; and providing the second voltage signal to circuitry external to the integrated circuit. The first voltage may correspond to a supply voltage of the integrated circuit and the second voltage corresponds to the supply voltage of the external circuitry. The method may further comprise: providing the first current signal to a first circuit external to the integrated circuit, the first circuit being configured to convert the first current into a third voltage.

The integrated circuit may be in a first voltage domain and the circuitry external to the integrated circuit is in a second voltage domain. The first input/output cell may be configured to operate in low voltage conditions. The first circuit may comprise a transimpedance amplifier.

According to a third aspect, there is provided a system comprising: the integrated circuit of the first aspect; and a first circuit external to the integrated circuit configured to convert the first current into a voltage; wherein the integrated circuit is in a first voltage domain and the circuitry external to the integrated circuit is in a second voltage domain.

According to a fourth aspect, there is provided an integrated circuit comprising; a digital core; a first input/output cell configured to receive a first current from circuitry external to the integrated circuit, convert the first current to a first voltage to be provided to the digital core.

The integrated circuit may further comprise: a second input/output cell configured to convert receive a second voltage signal from circuitry external to the integrated circuit and convert the second voltage signal to a third voltage signal to be provided to the digital core.

According to a fifth aspect, there is provided a method comprising: receiving by a first input/output cell, a first current signal from circuitry external to an integrated circuit; converting the first current signal to a first voltage signal by the first input/output cell; and providing the first voltage signal to a digital core.

The method may comprise: receiving a second voltage signal at second input/output cell from circuitry external to an integrated circuit; converting the second voltage signal to a third voltage signal by the second input/output cell; and providing the third voltage signal to the digital core.

FIGURES

Figure 2:
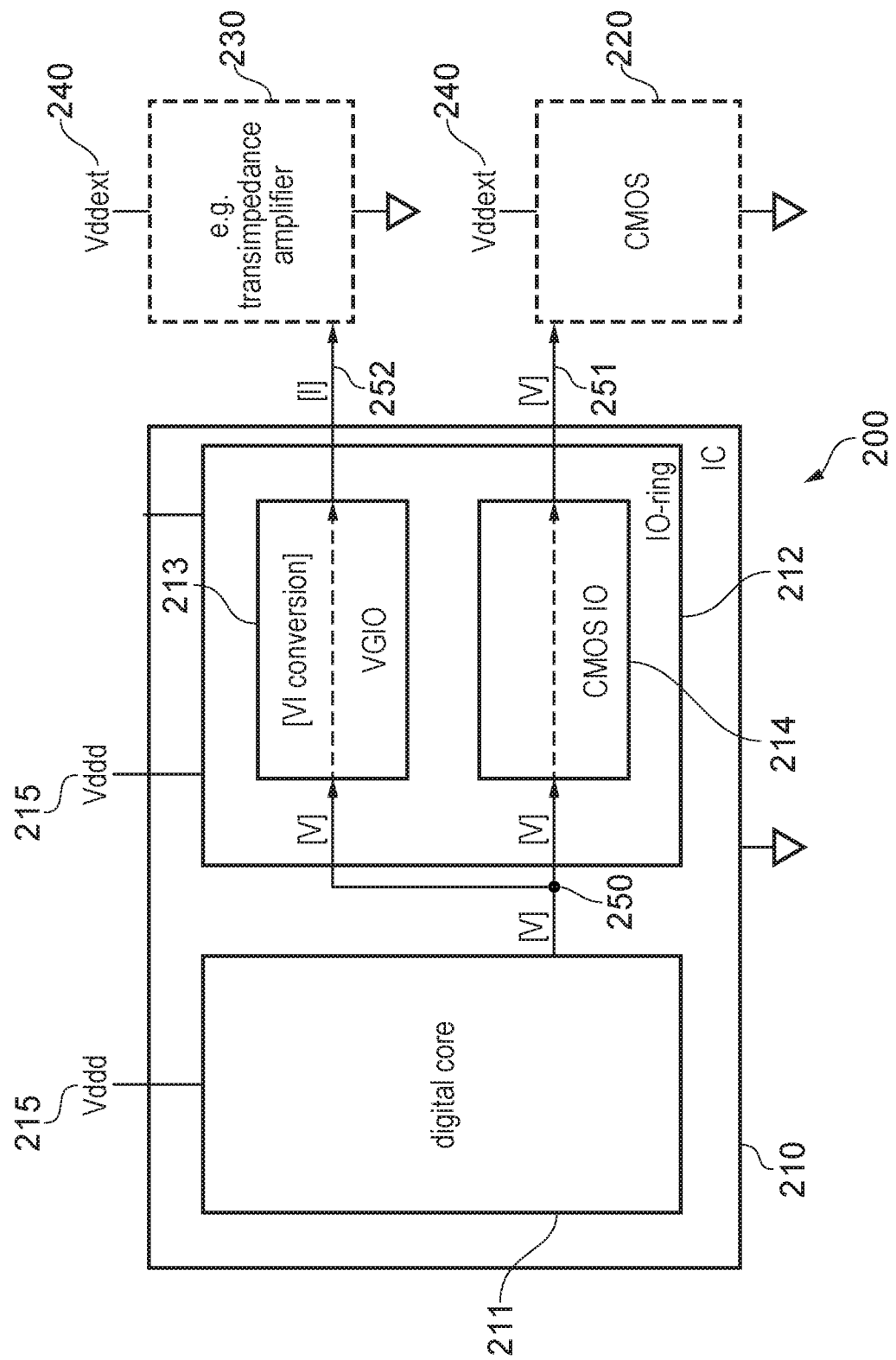

Embodiments will be described, by way of example only, with reference to the drawings, in which:

FIG. 1 is an example of a system including an integrated circuit with a digital core; and FIG. 2 is an example of a system comprising an integrated circuit according to an embodiment.

DETAILED DESCRIPTION

FIG. 1 shows an example of a system comprising an integrated circuit having a digital core. The system 100 comprises an integrated circuit 110 having a digital core 111 and a CMOS IO cell 112. The integrated circuit is provided with an IC supply voltage 113 which is coupled to both the digital core 111 and the IO cell 112. It will be appreciated that in some embodiments, the IC supply voltage 113 may be converted to another voltage before being provided to the IO cell 112, however it will be appreciated that the source voltage for the integrated circuit is IC supply voltage 113.

The IC 110 is coupled to further circuitry 120 via a voltage output 130 of the IO cell 112. The further circuitry is external to the IC 110. The external circuitry 120 may also be CMOS circuitry and may be related to a testing or other functionality of the system 100. The external circuitry 120 may be provided with an external supply voltage 121, where is external means external to the IC.

In operation, the digital core may produce an output voltage 131 and provide this output voltage 131 to the IO cell 112. In one example the output voltage 131 is a rail-to-rail voltage signal with a maximum amplitude of the IC supply voltage 113. The IO cell 112 receives the voltage signal 131 from the digital core 111 and converts it to be compatible with the external voltage supply 121. The IC 113 and the external circuitry 120 may be in two voltage domains corresponding respectively to the IC supply voltage 113 and the external supply voltage 121. The IO cell 112 may convert a first voltage signal 131 in a first voltage domain into a second voltage signal 130 compatible with the second voltage domain. The second voltage signal 130 is then provided to the external circuitry.

In some systems, the IO cell 112 may convert the first voltage 131 to the second voltage 130 by level shifting the voltage to be compatible with the external supply voltage 121.

In some applications, it may be a requirement that the digital core operates at low voltage conditions. Normal operating conditions can be considered to be a typical voltage +/−10%. The typical voltage may be the ideal voltage under which the digital core was designed to operate, it will be appreciated that this may differ dependent on the application or use of the digital core. Anything less than typical voltage less 10% may be considered to be low voltage conditions. For example, for a typical supply voltage of 1.2V, normal operating conditions can be considered to be between 1.08V to 1.32V. This may be the case where the digital core is designed with a 10% tolerance for supply voltage variation. Low voltage conditions may include conditions where the IC supply voltage 113 is provided at less than 10% of the operational or typical supply voltage. In this specific above example, low voltage conditions will occur if the digital core receives a voltage less than 1.08V. For example the IC supply voltage may drop to 0.9V or even less depending on what the digital core is expected to handle.

As can be seen from FIG. 1, the IO cell 112 is supplied from the IC supply voltage 113. When the digital core 111 is put under low supply condition, the supply to the IO cell 112 is also lowered during the testing.

Typically, suppliers of IO cells may characterize their products within 10% of the typical supply voltage and are not designed for low supply conditions. When low supply conditions are applied, voltage headroom for the IO cells may become a problem and providing the (digital) voltage signal externally to the IC may become a problem. In particular, voltage level shifter circuits in an IO cell may not be able to cope with low input voltage levels. This may introduce difficulties in the functional and POR (Power-on-Reset) level testing of a digital core under low supply voltage conditions.

Embodiments of the present application may provide IO cell circuitry to convert a voltage output of a digital core to a current. This may aid the ability to provide reliable signal transfer off the IC during low voltage conditions. The IO cell may convert a signal from the digital core from a voltage domain to a current domain which may lead to robustness in terms of low voltage conditions.

FIG. 2 shows an example of a system according to an embodiment.

FIG. 2 depicts a system 200 comprising an IC 210 having a digital core 211 and an IO ring or block 212. The IO ring 212 comprises a first IO cell 213 and a second IO cell 214. The digital core 211 and the IO ring 212 are supplied by a first or IC supply voltage 215. Again, it will be appreciated that the supply voltage 215 may be converted to another voltage before being provided to either of the IO cells 213, 214 or the digital core, however the IC supply voltage 215 provides the source voltage for the IC 210.

The system 200 further comprises first and second external circuitry 230 and 220. In this example, the external circuitry may be CMOS or other circuitry used for the testing or functional operation of the system 200.

Similar to the system 100, in operation, the digital core 211 may produce an output voltage 250 and provide this output voltage 250 to the second IO cell 214. In one example the output voltage 250 is a rail-to-rail voltage signal with a maximum amplitude of the IC supply voltage 215. The second IO cell 214 receives the voltage signal 250 from the digital core 211 and converts it to be compatible with the external voltage supply 240.

The IC 210 and the external circuitry 220, 230 may be in two voltage domains corresponding respectively to the IC supply voltage 215 and the external supply voltage 240. The second IO cell 214 may convert a first voltage signal 250 in a first voltage domain into a second voltage signal 251 compatible with the second voltage domain. The second voltage signal 251 is then provided to the external circuitry. The second IO cell 214 may be a CMOS IO cell and may, for example, provide level shifting to convert the first voltage signal 250 to the second voltage signal 251.

The first voltage signal 250 from the digital core 211 may be provided to the first IO cell 213. The first IO cell 213 may convert the first voltage 250 from a voltage domain to a current domain and provide a current signal 252 externally to the IC 210. In this example the first IO cell 213 may be a virtual ground input output cell. It will be appreciated that the first IO cell 213 may operate according to any mechanism to convert the voltage signal to a current signal. For example, the circuitry may be appropriately designed and sized to fit onto the digital core 211.

The first IO cell 213 may be parallel to the second IO cell 214. Converting the first voltage signal to a current signal may provide a more reliable transportation of the signal externally to the IC 210 as the transportation of signals in the current domain may be more robust under low supply voltage conditions. This may be due to the availability of low voltage circuit techniques, inherently used for the VI conversion.

The system 200 may optionally include first external circuitry 230 for converting the current signal 252 back to a voltage signal. In this example, the current signal 252 may be provided externally to the IC 210 to the first external circuitry 230. The first external circuitry 230 may, for example, convert the current signal 252 to a voltage signal. In one example, the first external circuitry 230 may be a transimpedance amplifier. Conversion back into the voltage domain may be useful in cases where low voltage conditions tests are developed for the voltage domain.

In some examples, output from the first IO cell 213 may only be taken when the IC 210 is operating in low voltage conditions. When the IC 210 is operating under normal operating conditions the output may be taken from the second IO cell 214. In other examples, both the first and second IO cells may provide respective outputs 251, 252 under all conditions and external circuitry may select which output to process.

In operation the digital core 211 may provide a first voltage output 250. The first IO cell 213 may receive the first voltage 250 and convert it to a current output 252. The current output may optionally be received by a first external circuitry 230 and converted to a third voltage. The digital core 211 and first and second IO cells 213 and 214 may form part of an IC 210 in a first voltage domain (Vddd). The first external circuitry 230 may be part of a second voltage domain (Vddext). The first IO cell 213 and first external circuit 230 may convert the first voltage 250 from a voltage in the first digital domain to a third voltage in the second digital domain. The second IO cell 214 may receive the first voltage 250 and convert it to a second voltage 251 suitable for the second digital domain.

The foregoing has exemplified providing signals from a digital core through IO of an IC to be provided off-chip (external to the IC). It will however be appreciated that embodiments may similarly work to receive signals external to the IC and provide them to the digital core. In this case the direction of the arrows in FIG. 2 would be reversed.

For example, under normal operating conditions an input voltage 251 may be provided from external circuitry 220 to the second IO cell 214. The second IO cell 214 may convert this voltage 251 to a voltage 250 to be provided to the digital core. Under low voltage operations, the first external circuitry 230 may convert a voltage to a current 252 and provide this current to the first IO cell 213. The first IO cell 213 may convert the current 252 to a voltage 250 to be provided to the digital core. It will be appreciated that in some embodiments, the first and second IO cells may operate in both low and normal voltage conditions.

It will be appreciated that embodiments of the present application may be applied in any application where a digital core is to operate or be tested in low voltage conditions and may be provided for any digital application. In a specific example, embodiments may form part of an amplifier, for example an audio amplifier, car radio processing unit or head unit. It will be appreciated however that embodiments may be applied in further applications.

The invention claimed is:

1. An integrated circuit comprising:
   a digital core configured to output a first voltage signal; and
   a first input/output cell;
   a second input/output cell; and
   wherein the first input/output cell is configured to convert the first voltage signal to a first current signal and provide the first current signal to circuitry external to the integrated circuit, wherein the second input/output cell configured to convert the first voltage signal to a second voltage signal and provide the second voltage signal to circuitry external to the integrated circuit.

2. The integrated circuit of claim 1, wherein the first voltage corresponds to a supply voltage of the integrated circuit and the second voltage corresponds to the supply voltage of the external circuitry.

3. The integrated circuit of claim 1, wherein the first current signal is provided to a first circuit external to the integrated circuit, the first circuit being configured to convert the first current into a third voltage.

4. The integrated circuit of claim 1, where the integrated circuit is in a first voltage domain and the circuitry external to the integrated circuit is in a second voltage domain.

5. The integrated circuit of claim 1, wherein the first input/output cell is configure to operate in low voltage conditions.

6. The integrated circuit of claim 3, wherein the first circuit comprises a transimpedance amplifier.

7. A system comprising:
   the integrated circuit of claim 1; and
   a first circuit external to the integrated circuit configured to convert the first current into a voltage;
   wherein the integrated circuit is in a first voltage domain and the circuitry external to the integrated circuit is in a second voltage domain.

8. A method comprising:
   providing a first output voltage signal from a digital core to a first input/output cell;
   converting the first output voltage signal to a first current signal by the first input/output cell;
   providing the first current signal to circuitry external to the integrated circuit;
   providing the first output voltage signal from the digital core to a second input/output cell;
   converting the first output voltage signal to a second output voltage signal; and
   providing the second output voltage signal to circuitry external to the integrated circuit.

* * * * *